(12) United States Patent
Liang et al.

(10) Patent No.: US 6,346,729 B1
(45) Date of Patent: Feb. 12, 2002

(54) PSEUDO SILICON ON INSULATOR MOSFET DEVICE

(75) Inventors: Mong-Song Liang; Jin-Yuan Lee; Chue-san Yoo, all of Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/575,445

(22) Filed: May 22, 2000

Related U.S. Application Data

(62) Division of application No. 09/133,353, filed on Aug. 13, 1998, now Pat. No. 6,071,783.

(51) Int. Cl.$^7$ .............................................. H01L 31/119
(52) U.S. Cl. ........................ 257/344; 257/347; 438/300
(58) Field of Search ................................ 257/408, 355, 257/344, 347; 438/301, 300, 305, 303

(56) References Cited

U.S. PATENT DOCUMENTS

| | | | |
|---|---|---|---|
| 5,610,083 A | | 3/1997 | Chan et al. ..................... 437/21 |
| 5,620,912 A | * | 4/1997 | Hwang et al. ............... 438/301 |
| 5,691,231 A | | 11/1997 | Kobayashi et al. ........... 437/62 |
| 5,780,912 A | * | 7/1998 | Burr et al. ................... 257/408 |
| 5,943,575 A | * | 8/1999 | Chung ......................... 438/300 |
| 6,015,993 A | * | 1/2000 | Voldman et al. ............. 257/355 |
| 6,060,364 A | * | 5/2000 | Maszara et al. ............. 438/305 |

* cited by examiner

Primary Examiner—David Nelms
Assistant Examiner—Bau T Le
(74) Attorney, Agent, or Firm—George O. Saile; Stephen B. Ackerman

(57) ABSTRACT

A process for forming a MOSFET device, featuring a heavily doped source/drain region, isolated from a semiconductor substrate, via use of a thin silicon oxide layer, has been developed. After formation of a lightly doped source/drain region, an opening is created in the semiconductor substrate, in a region between insulator spacers, on a gate structure, and insulator filled, shallow trench regions, resulting in lightly doped source/drain segments, remaining under the masking insulator spacers. After a thin silicon oxide layer is formed on the exposed silicon surfaces, in the openings, a silicon deposition, and etch back procedures are performed, partially refilling the openings to a depth that still allows the thin silicon oxide layer to be exposed on the sides of the lightly doped source/drain segment. After removal of the exposed portion of the thin silicon oxide layer, and after deposition and etch back of another silicon layer, completely filling the openings, a heavily doped source/drain region is formed in the silicon layers, residing in the openings.

4 Claims, 3 Drawing Sheets

PSEUDO SILICON ON INSULATOR MOSFET DEVICE

This is a division of patent application Ser. No. 09/133,353, filing date Aug. 13, 1998 now U.S. Pat. No. 6,071,783, A Pseudo Silicon On Insulator Mosfet Device, assigned to the same assignee as the present invention.

BACKGROUND OF THE INVENTION (1) Field of the Invention

The present invention relates to methods used to fabricate semiconductor devices, and more specifically to a method used to fabricate a metal oxide semiconductor field effect transistor, (MOSFET), device, in which the source/drain region of the MOSFET device, is isolated from the semiconductor substrate, by a thin silicon oxide layer.

(2) Description of the Prior Art

The semiconductor industry is continually striving to improve the performance of devices, via use of micro-miniaturization, or the use of sub-micron features. The objective of micro-miniaturization has been successfully addressed via advances in specific semiconductor fabrication disciplines, such as photolithography and dry etching. The use of more sophisticated exposure cameras, as well as the use more sensitive photoresist masking materials, have allowed sub-micron images to be routinely achieved in masking photoresist layers. In addition the development of advanced dry etching tools, and procedures, have allowed the sub-micron images in photoresist masking layers, to be successfully transferred to underlying materials, used for the fabrication of sub-micron MOSFET devices. These sub-micron, MOSFET features, such as the sub-micron channel length, located under narrow gate structures, between source/drain regions, allow increased MOSFET performance to be achieved. In addition the smaller MOSFET features, achieved via fabrication enhancements, result in capacitance decreases, such as a decreased source/drain to substrate capacitance, achieved via smaller source/drain features, thus also resulting in improvement of MOSFET device performance.

In addition to MOSFET performance enhancements, achieved via micro-miniaturization, and the accompanying reductions in performance degrading capacitance, additional capacitance decreases, or performance enhancements can be achieved via structural enhancements. The use of a silicon on insulator, (SOI), technology, allowing the MOSFET device to be fabricated on a SOI layer results in capacitance decreases between the semiconductor substrate, and overlying, interfacing regions of the MOSFET device. For example Chan et al. in U.S. Pat No. 5,610,083, teach a procedure for fabricating a MOSFET device on a SOI layer, and thus achieve performance enhancements, when compared to counterparts, where the MOSFET device was formed directly on a semiconductor substrate. However the use of special semiconductor substrates, needed for the SOI technology, is expensive, and although performance objectives may be satisfied using a SOI wafer, the as important cost objectives, are not satisfied.

This invention will describe a procedure for obtaining a MOSFET in which an insulator layer is formed only between heavily doped source/drain regions and the semiconductor substrate. The use of this insulator layer, or the pseudo SOI layer, results in capacitance reductions, performance enhancements, via removal of the source/drain to substrate interface, while maintaining cost, via use of a conventional semiconductor substrate.

SUMMARY OF THE INVENTION

It is an object of this invention to improve the performance of a MOSFET device, by minimizing junction capacitance.

It is another object of this invention to fabricate a MOSFET device, using a thin insulator layer only between heavily doped/source drain regions, and the semiconductor substrate.

In accordance with the present invention a method for fabricating a MOSFET device, using an insulator layer between a heavily doped source/drain region, and the semiconductor substrate, used to decrease junction capacitance, is described. A gate insulator layer is thermally grown on regions of a semiconductor substrate, between isolation regions. A polysilicon gate structure, with an overlying insulator hard mask, is formed on the gate insulator layer. A lightly doped source/drain is formed in the region of the semiconductor substrate, not covered by the polysilicon gate structure, followed by the creation of insulator spacers, on the sides of the polysilicon gate structure. An anisotropic, reactive ion etching, (RIE), procedure is employed to remove regions of the semiconductor substrate, not covered by the polysilicon gate structure, not covered by the insulator spacers, and not covered by the isolation regions, resulting in openings in the semiconductor substrate, between the insulator spacers, on the polysilicon gate structure, and the isolation regions, and also resulting in a segment of the lightly doped source and drain region, underlying the insulator spacer. A thin insulator layer is next thermally grown on the exposed surfaces of the opening in the semiconductor substrate. A first silicon deposition, and etch back, is performed to refill the opening in the semiconductor substrate, to a level approximately equal to the bottom of the lightly doped source/drain segment. The thin insulator layer, on the sides of the lightly doped source/drain segment is next removed, followed by a second silicon deposition, and etch back, completely filling the opening in the semiconductor substrate. A heavily doped source/drain region is then formed in the silicon fill, in the opening in the semiconductor substrate, with the heavily doped source/drain region interfacing the region of the lightly doped source/drain segment, located under the insulator spacer, and with the reemainder of the heavily doped source/drain region residing on the thin insulator layer, in the region in which the thin insulator layer overlays the sides of the opening in the semiconductor substrate.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

A method for fabricating a MOSFET device, using a thin insulator between a heavily doped source/drain region, and the semiconductor substrate, will now be described in detail. The MOSFET device used in this invention, is an N channel, or NFET device, however this invention can be applied to P channel, (PFET), devices, or to complimentary, (CMOS), device, comprised of both NFET and PFET devices.

Figure 1:
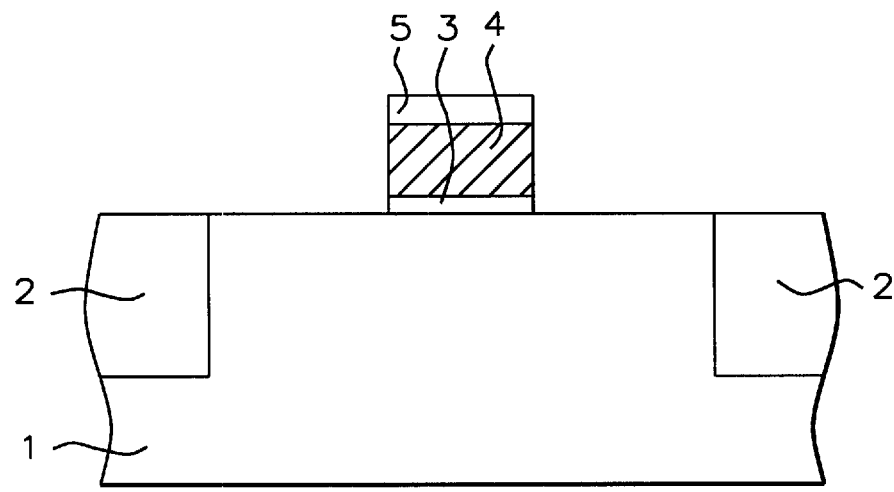
FIGS. 1–8, which schematically, in cross-sectional style, describe the key stages of fabrication, used to create a MOSFET device, using a pseudo SOI approach, or a thin insulator layer between source/drain and substrate, for junction capacitance optimization.

A P type, single crystalline, silicon substrate 1, with a <100> crystallographic orientation, is used, and shown schematically in FIG. 1. Shallow trench isolation, (STI), regions 2, are formed in the semiconductor substrate, for purposes of isolation. Briefly, STI regions 2, are formed by initially creating a shallow trench, to a depth in semiconductor substrate 1, between about 2000 to 5000 Angstroms, via photolithographic and anisotropic RIE procedures, using $Cl_2$ as an etchant. After removal of the photoresist shape, used for definition of the shallow trench, via plasma oxygen ashing and careful wet cleans, a silicon oxide layer is deposited via low pressure chemical vapor deposition, (LPCVD), or plasma enhanced chemical vapor deposition, (PECVD), procedures, completely filling the shallow trench. Removal of regions of the silicon oxide layer, overlying semiconductor substrate 1, are removed using anisotropic RIE procedure, using $CHF_3$ as an etchant, resulting in STI regions 2, shown schematically in FIG. 1. A chemical mechanical polishing, (CMP), procedure can be used in place of the anisotropic RIE procedure, to remove unwanted regions of the silicon oxide layer, also field oxide, (FOX), regions, created via thermal oxidation procedures, can be used in place of STI regions, if desired.

A gate insulator layer 3, comprised of silicon dioxide, is next formed via thermal oxidation in an oxygen—steam ambient, to a thickness between about 25 to 100 Angstroms. A polysilicon layer 4, is next deposited using LPCVD procedures, to a thickness between about 1000 to 3000 Angstroms, using silane as a source. Polysilicon layer 4, can be doped in situ, during deposition, via the addition of arsine, or phosphine, to the silane ambient, or polysilicon layer 4, can be deposited intrinsically, then doped via ion implantation procedures, using arsenic or phosphorous ions. In addition, if lower resistance is needed, polysilicon layer 4, can be replaced by a polycide, (metal silicide —polysilicon layer), via deposition of a metal silicide layer, such as tungsten silicide, on an underlying polysilicon layer. Finally insulator layer 5, comprised of either silicon oxide, or silicon nitride, is deposited using either LPCVD, or PECVD procedures, to a thickness between about 200 to 2500 Angstroms. Conventional photolithographic and RIE, procedures, using $CHF_3$ as an etchant for silicon oxide layer 5, ($CHF_3$ would also be used as an etchant if insulator layer 5, is silicon nitride), and $Cl_2$ as an etchant for polysilicon layer 4, are used to produce polysilicon gate structure 4, capped with insulator layer 5. Removal of the photoresist shape, used for definition of polysilicon gate structure 4, schematically shown in FIG. 1, is accomplished via plasma oxygen ashing and careful wet cleans.

Figure 2:
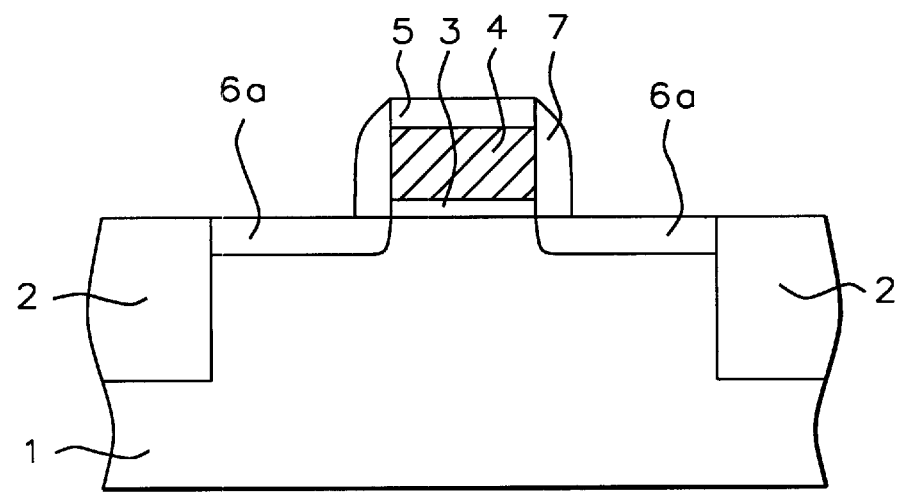

A lightly doped source/drain region 6a, is next created via ion implantation of phosphorous or arsenic, at an energy between about 5 to 30 KeV, at a dose between about 1E13 to 5E14 atoms/cm$^2$, in a region of semiconductor substrate 1, not covered by polysilicon gate structure 4. Next an insulator layer 7, comprised of silicon nitride, is deposited, again via use of either LPCVD or PECVD procedures, to a thickness between about 500 to 2000 Angstroms. Insulator layer 7, can be a silicon oxide layer, if desired, also obtained using LPCVD or PECVD procedures. An anisotropic RIE procedure, using $CHF_3$ as an etchant for silicon nitride, (also using $CHF_3$ as an etchant for silicon oxide), is used to create insulator spacers 7, on polysilicon gate structures 4. This is schematically shown in FIG. 2. A segment of lightly doped source/drain region 6a, now resides under insulator spacer 7.

Figure 3:
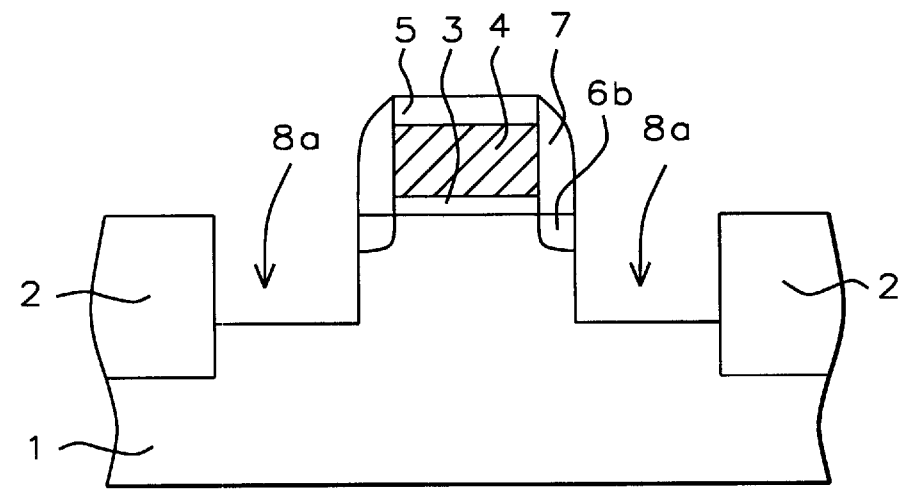
Figure 4:
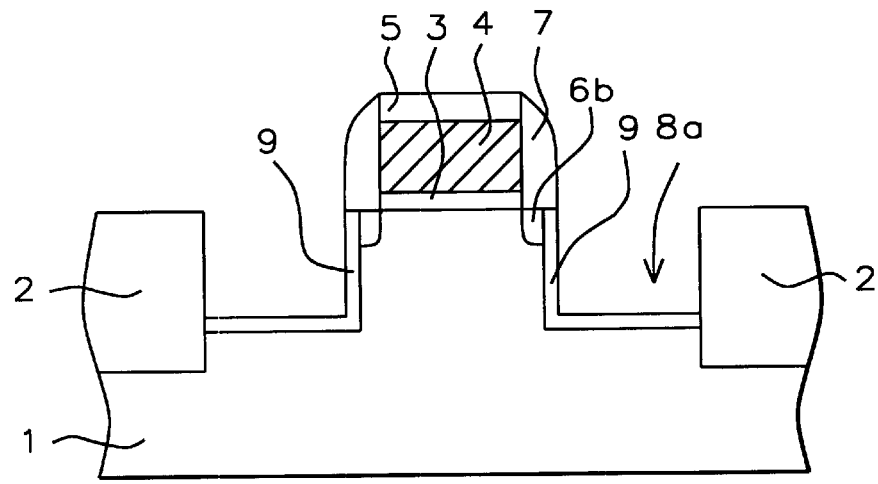

FIG. 3, shows the result of removing the region of semiconductor substrate 1, located between insulator spacers 7, on the sides of polysilicon gate structure 4, and STI regions 2, accomplished via a selective, anisotropic RIE procedure, using $Cl_2$ as an etchant. The use of $Cl_2$ as an etchant, allows semiconductor substrate 1, to be removed, while exposed insulator layer 5, insulator spacers 7, and STI regions 2, are not attacked. This procedure, creating opening 8a, with a depth between about 1000 to 3000 Angstroms, below the top surface of semiconductor substrate 1, removes exposed regions of lightly doped source/drain region 6a, resulting in lightly doped source/drain segment 6b, protected by insulator spacers 7, during the creation of opening 8a. A silicon dioxide layer 9, is next grown, to a thickness between about 40 to 500 Angstroms, via the thermal oxidation of the exposed surfaces of opening 8, in an oxygen—steam ambient. Silicon oxide layer 9, is formed on the surfaces of semiconductor substrate 1, and the surface of lightly doped source/drain segment 6b, exposed in opening 8a. The formation of silicon oxide layer 9, on the exposed side of lightly doped source/drain segment 6b, resulted in the edge of lightly doped source/drain segment 6b, to now be located under insulator spacer 7. This is shown schematically in FIG. 4.

Figure 5:
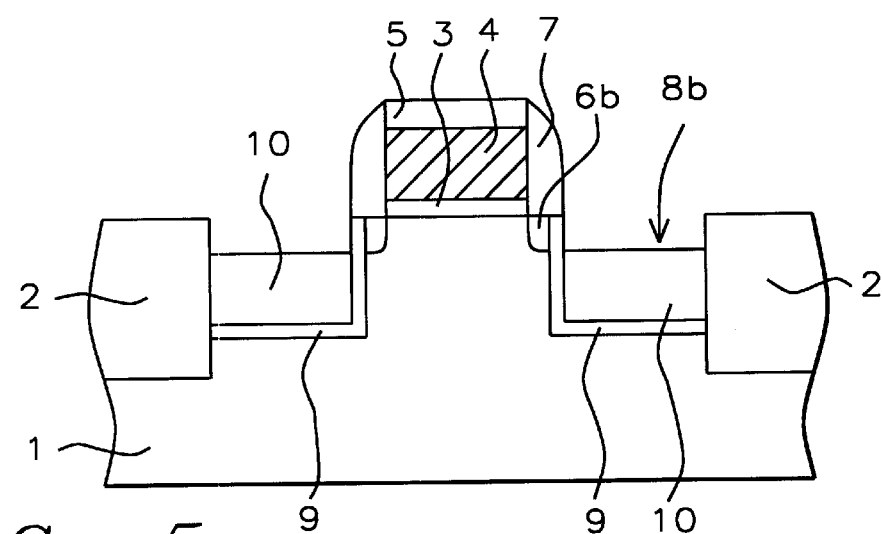
Figure 6:
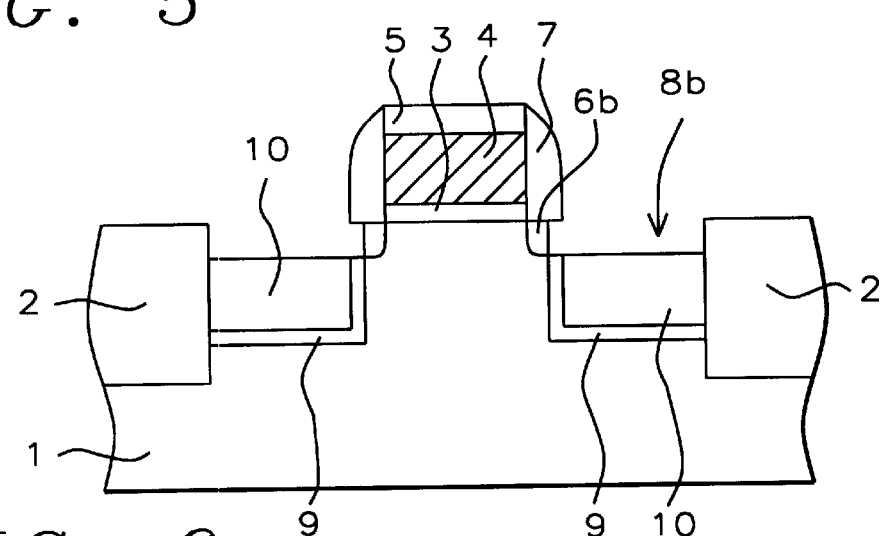

A first deposition of an intrinsic silicon layer 10, comprised of either polysilicon or amorphous silicon, is next performed via LPCVD procedures, to a thickness between about 1000 to 6000 Angstroms, completely filling opening 8a. If desired, an amorphous silicon layer can be deposited, then annealed, to convert the amorphous silicon layer to a single crystalline silicon layer. A first chemical mechanical polishing, (CMP), procedure is used to polish silicon layer 10, followed by a first, selective anisotropic RIE procedure, using $Cl_2$ as an etchant, is used to etch back the silicon layer 10, to a depth in which the top surface of silicon layer 10, is between about 300 to 1500 Angstroms below the top surface of semiconductor substrate 1, exposing the portion of silicon oxide layer 9, which resides on the side of lightly doped source/drain segment 6b, and creating opening 8b. This is schematically shown in FIG. 5. A isotropic wet etch, using a buffered hydrofluoric acid solution, or a dilute hydrofluoric acid solution, is used to remove the exposed portion of silicon oxide layer 9, exposed in opening 8b, resulting in the exposure of the side of lightly doped source/drain segment 6b. This is schematically shown in FIG. 6.

Figure 7:
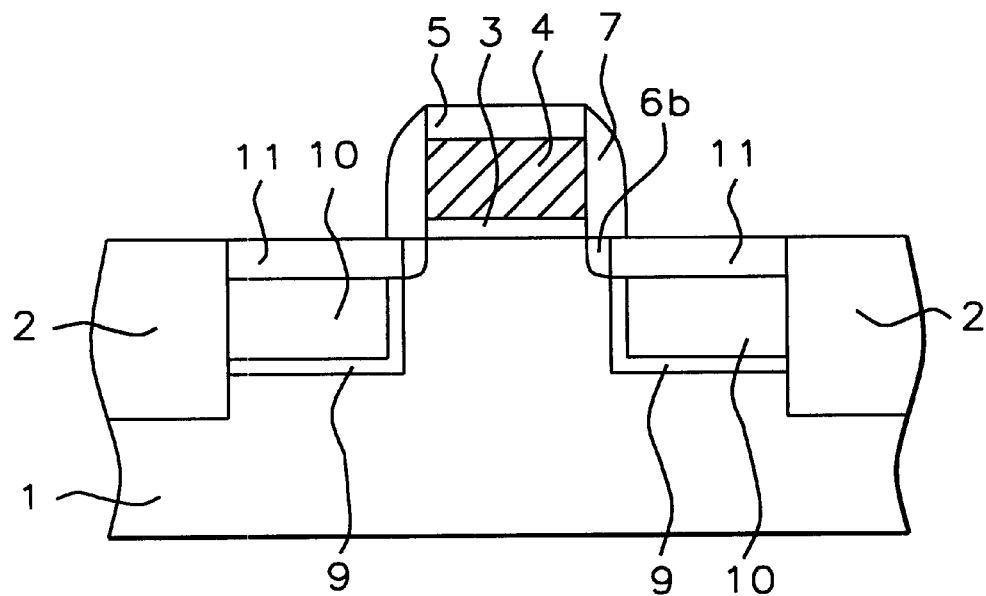
Figure 8:
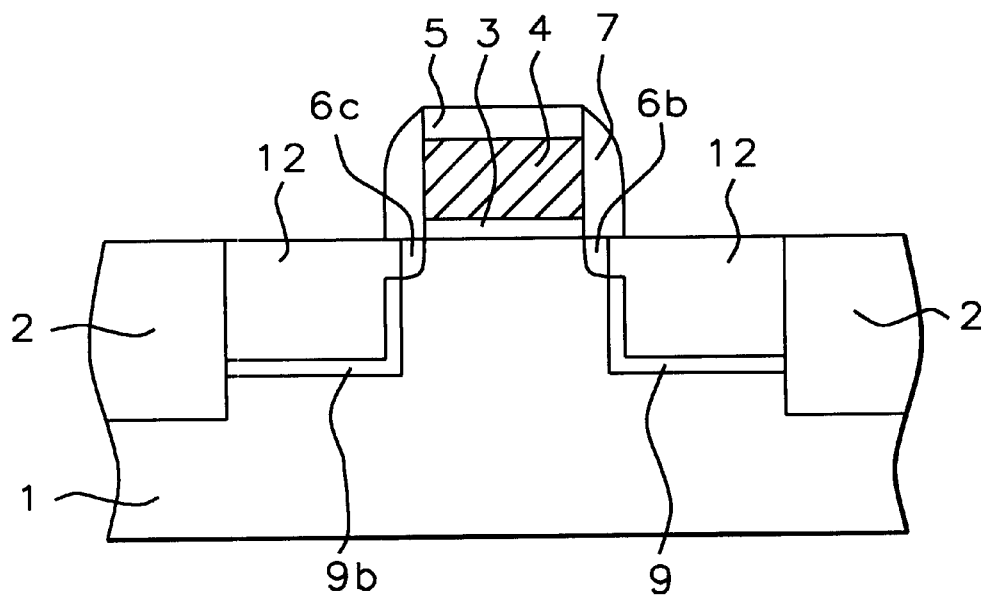

A second deposition of an intrinsic silicon layer 11, is performed using LPCVD procedures, to a thickness between about 1000 to 6000 Angstroms, completely filling opening 8b. Silicon layer 11, can either be a polysilicon layer, a amorphous silicon layer, or a amorphous or polysilicon layer, subjected to an anneal procedure to create a single crystalline silicon layer. A second CMP procedure, followed by a second, selective anisotropic RIE procedure, using $Cl_2$ as an etchant, is used to etch back silicon layer 11, to a depth in which the top surface of silicon layer 11, is at the same level as the top surface semiconductor substrate 1. In addition silicon layer 11, interfaces the side of lightly doped source/drain segment 6b, in the region directly underlying insulator spacer 7. This is schematically shown in FIG. 7. Finally a ion implantation procedure is performed, using phosphorous or arsenic ions, at an energy between about 10 to 50 KeV, at a dose between about 1E15 to 1E16 atoms/cm$^2$, followed by an anneal procedure, at a temperature between about 700 to 1100° C., creating heavily doped source/drain region 12, in silicon layer 10, and silicon layer 11. Heavily doped source/drain region 12, shown schematically in FIG. 8, is isolated from semiconductor substrate 1, via silicon oxide layer 9, and thus offers less junction capacitance, and increased performance, compared to counterparts fabricated using heavily doped source/drain regions in direct contact with the semiconductor substrate. The only region in which the heavily doped source/drain region 12, is not isolated by silicon oxide layer 9, is where contact to lightly doped source drain segment 6b, occurs. Thus the process for creating a pseudo MOSFET device, using a thin silicon oxide layer, to reduce junction capacitance arising at the interfaces of MOSFET regions, can be used as an inexpensive alternative to creating MOSFET devices in a SOI layer.

While this invention has been particularly shown and described with reference to, the preferred embodiments thereof, it will be understood by those skilled in the art that various changes in form and details may be made without departing from the spirit and scope of this invention.

What is claimed is:

1. A MOSFET device structure, on a semiconductor substrate, comprising:

insulator filled shallow trench, isolation regions, in said semiconductor substrate;

a device region located between insulator filled shallow trench, isolation regions;

a polysilicon gate structure, on an underlying silicon dioxide gate insulator layer, in the center of said device region;

a capping, insulator layer on the top of said polysilicon gate structure;

insulator spacers on the sides of said polysilicon gate structure;

a lightly doped source/drain segment, in a region of said semiconductor substrate, located completely underlying said insulator spacers;

an L shaped, thin silicon oxide layer, comprised of a vertical shape, extending vertically downward from the bottom of said lightly doped source/drain segment, and a horizontal shape, extending horizontally from the bottom of said vertical shape, of said L shaped thin silicon oxide layer, to the side of an insulator filled shallow trench, isolation region; and a heavily doped source/drain region, in single crystalline silicon, bounded by said L shaped, thin silicon oxide layer, and by said insulator filled shallow trench, isolation region, and interfacing and contacting, the side of said lightly doped source/drain segment, located under said insulator spacer.

2. The MOSFET Device Structure of claim 1, wherein said insulator spacers are comprised of silicon oxide, at a thickness between about 500 to 2000 Angstroms.

3. The MOSFET device structure of claim 1, wherein said L shaped, thin silicon oxide layer, is between about 40 to 500 Angstroms, in thickness.

4. The MOSFET Device Structure of claim 1, wherein said L shaped, thin silicon oxide layer, extends vertically downward, between about 1000 to 3000 Angstroms, from the top surface of said semiconductor substrate.

* * * * *